United States Patent [19]
Zeiger

[11] Patent Number: 5,229,724
[45] Date of Patent: Jul. 20, 1993

[54] SAMPLE HEAD FOR NUCLEAR RESONANCE MEASUREMENTS

[75] Inventor: Heinz Zeiger, Waldbronn, Fed. Rep. of Germany

[73] Assignee: Bruker Analytische Messtechnik GmbH, Fed. Rep. of Germany

[21] Appl. No.: 642,626

[22] Filed: Jan. 17, 1991

[30] Foreign Application Priority Data

Jan. 25, 1990 [DE] Fed. Rep. of Germany ....... 4002160

[51] Int. Cl.[5] ............................................. G01V 3/00
[52] U.S. Cl. .................................... 324/322; 324/318
[58] Field of Search ............... 324/300, 307, 309, 314, 324/318, 322; 128/653.5

[56] References Cited

U.S. PATENT DOCUMENTS

| 4,446,431 | 5/1984 | McKay | 324/318 |
| 4,728,896 | 3/1988 | Bendall et al. | 324/318 |
| 4,801,885 | 1/1989 | Meissner et al. | 324/318 |
| 4,952,879 | 8/1990 | Van Vaals et al. | 324/322 |
| 4,996,482 | 2/1991 | Fujito | 324/318 |
| 5,038,105 | 8/1991 | Codrington et al. | 324/318 |

FOREIGN PATENT DOCUMENTS 3634030 10/1986 Fed. Rep. of Germany.

OTHER PUBLICATIONS

Review of Scientific Instruments, vol. 47, No. 12, Dec. 1976, pp. 1486 to 1488, "Single coil probe with transmission-line tuning for nuclear magnetic double resonance"-Author V. R. Cross, R. K. Hester, and J. S. Waugh.
Journal of Magnetic Resonance 43 (1981), pp. .339 to 416 "A Multinuclear Double-Tuned Probe for Applications with Solids or Liquids Utilizing Lumped Tuning Elements" Authors: F. David Doty, Ruth R. Inners, and Paul D. Ellis.
Review of Scientific Instruments, vol. 51 (7), Jul. 1980, pp. 887 to 890 "A single-coil triple resonance probe for NMR experiments" Authors: S. Kan, M. Fan, and J. Courtieu.

Primary Examiner—Louis Arana
Attorney, Agent, or Firm—Rosenblum, Parish & Isaacs

[57] ABSTRACT

A sample head for performing nuclear magnetic resonance measurements on a first kind of nuclei ($^1$H) and, further, on a second ($^{15}$N) or a third ($^{31}$P) kind of nuclei within a magnetic field (B) is disclosed. A measuring coil coacts with a sample under analysis and generates a nuclear magnetic resonance within the sample or receives a nuclear magnetic resonance signal from the sample. Terminals are provided for transmitting to or receiving from the measuring coil high-frequency signals having frequencies corresponding to the particular nuclear magnetic resonance frequency of the specific kinds of nuclei ($^1$H, $^{15}$N, $^{31}$P), respectively. A high-frequency line is connected to the measuring coil at one end thereof. The line has an electric length which is an integer multiple of a quarter wavelength corresponding to the first, higher frequency. Switching means are associated to the line for switching its electrical length according to two distinct modes of operations where the second and the third, lower frequencies have different values below the first, higher frequency. By actuating the switching means, the line acts as an inductance or as a capacitance, respectively, connected in series with the measuring coil.

18 Claims, 4 Drawing Sheets

Prior Art

SAMPLE HEAD FOR NUCLEAR RESONANCE MEASUREMENTS

FIELD OF THE INVENTION

The present invention relates to a sample head for nuclear resonance measurements where at least two different kinds of nuclei are excited in a magnetic field, comprising a measuring coil that cooperates with a sample and that is connected, on the one hand, to a first input terminal, for feeding in a signal of higher frequency exciting a first kind of nuclei and/or for receiving a resonance signal emitted by the nuclei of the first kind of nuclei and, on the other hand, to a second input terminal for feeding in a signal of lower frequency exciting a second kind of nuclei and/or for receiving a resonance signal emitted by nuclei of the second kind of nuclei, the measuring coil being connected to a r.f. line where the ratio between the electric length of the line and one fourth of the wavelength corresponding to the higher frequency is an integral number.

BACKGROUND OF THE INVENTION

A sample head of the type mentioned above is generally known, for example from U.S. publication "Review of Scientific Instruments", vol. 47, no. 12, December 1976, pages 1486 to 1488, from U.S. publication "Journal of Magnetic Resonance" 43 (1981), pages 399 to 416, and from U.S. Pat. No. 4,446,431.

The known sample heads are useful in carrying out nuclear double-resonance experiments. In the case of such experiments, one usually excites and/or observes protons ($^1$H) or fluorine ($^{19}$F) as a first kind of nuclei, while an isotope of nitrogen ($^{15}$N) or of phosphorus ($^{31}$P) or of carbon ($^{13}$C), for example, is excited and/or observed as a second kind of nuclei. The second kind of nuclei is generally described as "X nucleus".

The excitation frequency for protons ($^1$H), for example, may be 400 MHz with modern high-field nuclear resonance spectrometers. The excitation frequency (related to the same magnetic field strength) is then approx. 40.5 MHz for the before-mentioned isotopes of nitrogen ($^{15}$N), 162.0 MHz for the isotopes of phosphorus ($^{31}$P) and 100.5 MHz for the isotopes of carbon ($^{13}$C). The entire frequency range within which such double-resonance experiments are carried out, may vary between 40 and 400 MHz, but may in extreme cases even start below 40 MHz, depending on the particular kind of nuclei.

As will be explained in more detail further below, with reference to the embodiments of the invention, as compared to the prior art, the sample heads of the prior art are designed in such a way that the electric network of the sample head, comprising both the measuring coil and the r.f. line, has its equivalent circuit diagram optimized for the higher frequency, viewed from the first input terminal, and for the lower frequency, viewed from the second input terminal. With respect to the lower frequency, however, this can be achieved only for a relatively narrow range. A large frequency range, such as that resulting from the before-mentioned examples, with 40 MHz for $^{15}$N to 162 MHz for $^{31}$P, cannot be achieved for the lower frequency with the known sample heads, and this the less if the first frequency is 360 MHz or more. If, for example, the electric network of the sample head, viewed from the second input terminal, is rated for relatively low frequencies, the network would, in the case of higher frequencies, show such considerable additional inductances not employed by the sample substance that losses would be encountered, or only poor efficiency would be achieved, or it would be impossible altogether to attain the highest frequency (for example 162 MHz).

On the other hand, in the case of a configuration where the network of the sample head, viewed from the second input terminal, is rated for relatively low frequencies (for example by reducing drastically the inductance of the measuring coil), relatively poor properties would result in the lower range of the lower frequencies for the second kind of nuclei, and for the first kind of nuclei as well.

Now, it is the object of the present invention to improve a sample head and, thus, a method of the type described above in such a way as to enable nuclear resonance measurements, where signals can be irradiated and/or received via the second input terminal over a very broad frequency range, to be performed using one and the same sample head, with only certain minor commutation measures. Related to a $^1$H frequency of, for example, 400 MHz, the frequency range for the second signal fed in and/or received via the second input terminal is to span from a lower frequency of 40 MHz for $^{15}$N, which is lower by one order of magnitude than the $^1$H frequency, to an upper frequency of 162 MHz for $^{31}$P, which is somewhat lower than half the $^1$H frequency.

SUMMARY OF THE INVENTION

This object is achieved according to the invention by the fact that the electric length of the line can be switched over to the lower frequency by suitable circuit means so that in the case of measurements where the lower frequency of the second kind of nuclei ($^{15}$N) is lower by approximately one order of magnitude than the higher frequency of the first kind of nuclei ($^1$H), the line for the lower frequency has the effect of an inductance connected in series to the measuring coil, while for measurements where the lower frequency of the second kind of nuclei $^{31}$P is in the range of up to half the higher frequency of the first kind of nuclei $^1$H, the line for the lower frequency has the effect of a capacitance connected in series to the measuring coil. The conditions for the first frequency remain almost unchanged in both cases.

It is preferred in this connection that in the case of measurements where the lower frequency of the second kind of nuclei $^{15}$N is smaller by approximately one order of magnitude than the higher frequency of the first kind of nuclei $^1$H, the electric length is adjusted to one fourth of the wavelength $\lambda$ of the first kind of nuclei $^1$H, while for measurements where the lower frequency of the second kind of nuclei $^{31}$P is in the range of approximately half the higher frequency of the first kind of nuclei $^1$H, the electric length is adjusted to half the wavelength $\lambda$ of the first kind of nuclei $^1$H, or a multiple thereof.

Given the fact that it is possible with extremely simple circuitry means to change over the r.f. line to the second frequency in the indicated manner, at the point of the first voltage node for the first frequency, the network of the sample head—viewed from the second input terminal—can be adapted to ranges of relative low frequencies (such as $^{15}$N, $^{13}$C) on the one hand and of relatively high frequencies ($^{31}$P) on the other hand, by changing over the r.f. line.

Consequently, the problem underlying the present invention further can be achieved according to the method described above by the steps of carrying out initially a first measurement with first frequencies at a first setting of the line, and then a second measurement with second frequencies at a second setting of the line, leaving the sample and the sample head unchanged in the magnetic field during both measurements.

Compared with known arrangements and methods, this procedure provides the advantage that it is no longer necessary to change the measuring set-up physically if efficient measurements are to be carried out where the frequency of the second kind of nuclei varies over a large frequency range. Rather, it is now possible in an advantageous manner to carry out measurements where the sample and the sample head remain unchanged in the magnetic field which enables, for example, comparative measurements to be carried out immediately, for example in the case of biological samples, without any risk that the geometrical relationships to the measuring point in the sample may get lost by the physical change of the measuring set-up, for example if volume-selective nuclear resonance measurements are to be carried out.

The invention thus opens up completely new possibilities not only in the field of general nuclear resonance spectroscopy, but also in the field of nuclear spin tomography, for example if a conventional tomographic measurement on protons ($^1$H) and thereafter measurements with other kinds of nuclei, for example $^{31}$P or $^{15}$N are to be carried out in succession. The procedure according to the invention permits in these cases an exact comparison between the two measurements, the measurement site being identical for the two measurements, due to the unchanged measuring set-up.

In addition, the invention is particularly well suited for carrying out decoupling experiments at high power over a large frequency range, preferably for cross-polarization. The measurements are preferably carried out in this case using a so-called MAS sample head, this term being intended to describe a sample head by which the sample is rotated about an axis which extends at the so-called "magic angle" relative to the direction of the magnetic field.

According to a preferred embodiment of the sample head according to the invention, the circuitry means comprise a wire jumper which can be connected between the conductors of the line at a distance of one fourth of the wavelength $\lambda$ of the first kind of nuclei $^1$H from the beginning of the line which is connected to the measuring coil. This feature provides the advantage that while the wire jumper varies the electric length of the line for the second frequency, it does not substantially change the configuration of the field lines within the line, for example a coaxial line, for the first frequency.

According to a preferred first variant of this embodiment of the invention, the jumper can be connected between the conductors by soldering.

This feature provides the advantage that a r.f.-safe connection can be implemented by a simple technical measure.

According to another variant, the jumper is firmly arranged between the conductors and provided with an interruptor.

This feature provides the advantage that changing-over of the line can be effected by purely mechanical means and, thus, from the outside without any changes to the sample head.

According to a first group of embodiments of the sample head according to the invention, the signal corresponding to the first kind of nuclei is fed in via a connection point between the measuring coil and the line, in the manner known as such in the art.

According to another group of embodiments, the signal corresponding to the first kind of nuclei is fed into the line via a loop located at approximately one fourth of the wavelength $\lambda$ of the first kind of nuclei $^1$H from the beginning of the line connected to the measuring coil.

This feature allows inductive coupling in the area of a current antinode of the r.f. line for the higher frequency, which opens up additional adjusting possibilities.

According to other embodiments of the invention, the line is provided with capacitors in the area beyond one fourth of the wavelength $\lambda$ of the first kind of nuclei $^1$H, viewed from the beginning of the line connected to the measuring coil, so that line sections are formed in this area which have an electric length of one fourth of the wavelength $\lambda$ of the first kind of nuclei $^1$H.

If the system is sized conveniently, this feature provides the advantage that the additional series-connected capacitors permit capacitive unloading of the circuit for the second kind of nuclei so that the highest frequency for the signals of the second kind of nuclei can be raised still further.

Another preferred embodiment of the sample head according to the invention provides that the measuring coil is a surface coil adapted for being brought into contact with a sample surface.

This feature provides the advantage that the sample head according to the invention can be employed for measurements on living bodies, in particular living human bodies, without the need to introduce the body into a correspondingly big measuring coil.

The sample head according to the invention is further particularly well suited for carrying out measurements where the axis of the sample is inclined relative to the field axis at the so-called "magic angle", in the manner known as such, and is rotated about its axis.

The sample head and the method according to the invention can be employed with particular advantage at high measuring frequencies, in particular at measuring frequencies in the range above 400 MHz for the first kind of nuclei ($^1$H). The range of lower frequency of the second kind of nuclei (X) may, preferably, be between 10% and up to 40% of the higher frequency.

The method and the sample head according to the invention are particularly well suited for a plurality of measuring processes. For example, the invention can be employed with advantage for decoupling one kind of nuclei with high power, or for cross-polarization between different kinds of nuclei. According to a particularly preferred application, the invention is used for volume-selective measurements. The latter may be imaging measurements of the kind used in nuclear spin tomography, or else analytical measurements which latter need not necessarily be volume-selective.

Other advantages of the invention will appear from the specification and the attached drawing.

It is understood that the features that have been described before and will be explained hereafter may be used not only in the described combinations, but also in any other combination, or individually, without leaving the scope and intent of the present invention.

One prior-art example and one embodiment of the invention will now be described in more detail with reference to the drawing in which:

BRIEF DESCRIPTION OF THE DRAWINGS

FIG. 2A shows a representation similar to that of FIG. 1A, but for a sample head according to the invention;

FIGS. 2B to 2D shows equivalent circuit diagrams similar to those of FIGS. 1B and 1C, but related to the network according to FIG. 2A, FIG. 2B illustrating the condition where the interruptor is closed, while FIG. 2C illustrates the condition where the interruptor is open, viewed in both cases from a second input terminal, whereas FIG. 2D applies to both cases, viewed from a first input terminal;

DETAILED DESCRIPTION OF THE INVENTION

Figure 1A:
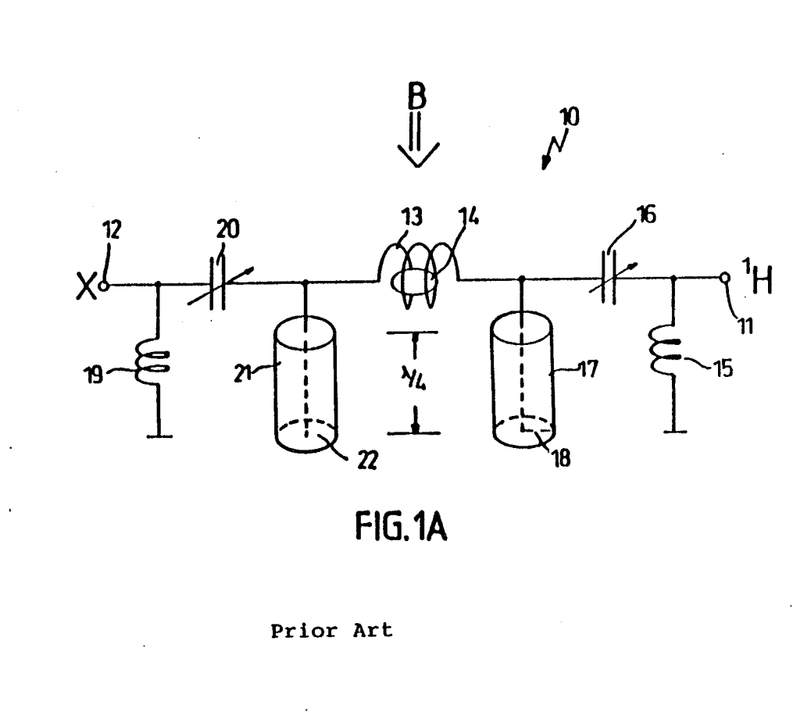
FIG. 1A shows an electric network of a sample head according to the prior art.

Regarding now FIG. 1A, reference numeral 10 indicates generally a sample head according to the prior art, in the form of a network symbolized by its two determining electric elements.

For exciting and/or receiving signals of a first kind of nuclei, for example for exciting protons ($^1H$), there is provided a first input terminal 11, while a second input terminal 12 serves for exciting or receiving a second kind of nuclei, for example isotopes of nitrogen ($^{15}N$) or phosphorus ($^{31}P$), indicated generally by X. The input terminals 11 and 12 are supplied with r.f. signals the frequency of which depends on the strength of the magnetic field B active at any time.

As indicated in FIG. 1A, the magnetic field B acts on a measuring coil 13 and a sample 14 located therein. The sample 14 may consist of a test tube containing a measuring substance, or may consist of a biological sample or else—in the case of a nuclear spin tomography measurement—of a part of a human body or a whole human body.

If, for example, the magnetic field B has a strength of 9.4 T, then the resonance frequency of hydrogen protons ($^1H$) is in the range of 400 MHz, while the resonance frequencies of the before-mentioned isotopes are lower, for example equal to 100.5 MHz for $^{13}C$, 40.5 MHz for $^{15}N$, 162.0 MHz for $^{31}P$, and 105.8 MHz for $^{23}Na$.

Regarding now once more FIG. 1A, it can be seen that the first input terminal 11 is connected to ground potential via an inductance 15 or another component permitting the frequency to be adapted to the characteristic impedance of the line, while on the other hand it is connected to the measuring coil 13, via an adjustable capacitance 16, and on the other hand to an $\lambda/4$ line 17. The connection 18 of the $\lambda/4$ line is a short-circuit connection.

On the other hand, the second input terminal 12 is likewise connected, on the one hand, to ground potential via an inductance 19 or another component permitting the frequency to be adapted to the characteristic impedance of the line, and, on the other hand, via an adjustable capacitance 20, to the measuring coil 13 and to another $\lambda/4$ line 21. The opposite end 22 of the last-mentioned $\lambda/4$ line is open however.

Figure 1B:
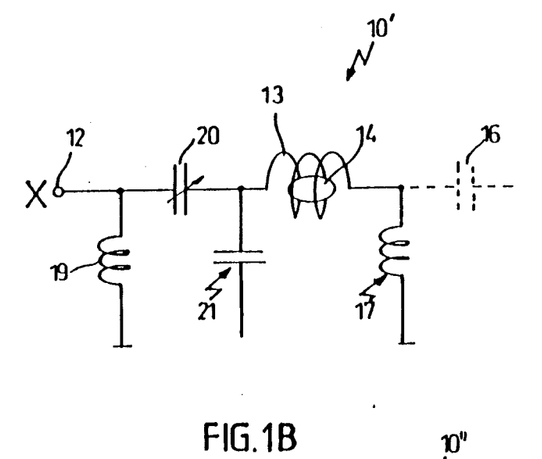
FIG. 1B shows an equivalent circuit diagram of the network of FIG. 1A, viewed from a second input terminal.

Regarding now the network of FIG. 1A from the second input terminal 12, there results a network 10' according to FIG. 1B.

In this case, the left $\lambda/4$ line 21, as viewed in FIG. 1A, acts like a capacitance for X frequencies, while the right $\lambda/4$ line acts like an inductance for X frequencies.

Figure 1C:
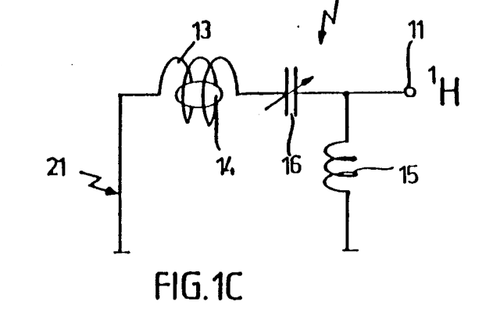
FIG. 1C shows another equivalent circuit diagram of the network illustrated in FIG. 1A, but viewed from a first input terminal.

The network 10' of FIG. 1C provides an analogous illustration for the $^1H$ frequency, viewed from the first input terminal 11.

When regarding this figure, it will be readily appreciated that the left $\lambda/4$ line 21 in FIG. 1A acts as short-circuit for $^1H$ frequencies, while the right $\lambda/4$ line 17 is very high impedance.

Now, if the network according to FIG. 1A were loaded on the side of the second input terminal 12 with a relatively high frequency, for example the 162.0 MHz required for $^{31}P$ measurements, then the left $\lambda/4$ line 21 would represent a capacitance that would get more and more disturbing, while on the other hand the right $\lambda/4$ line 17 would represent a series inductance that would get more and more disturbing. Consequently, an ever greater part of the energy of the r.f. signal supplied via the second input terminal 12 would get lost for the nuclear resonance process in this series inductance as the latter, contrary to the measuring coil 13, is not employed by the sample substance 14. Consequently, the efficiency would also deteriorate. Tuning to 162 MHz, for example, would in most of the cases not be possible due to the high inductance.

Of course, it would be possible in this case to connect an additional coil in parallel to the measuring coil 13 in order to reduce the total inductance for the second kind of nuclei (X); but this would again lead to undesirable energy splitting and, consequently, an undesirable losses in efficiency.

Figures 2A, 2B:
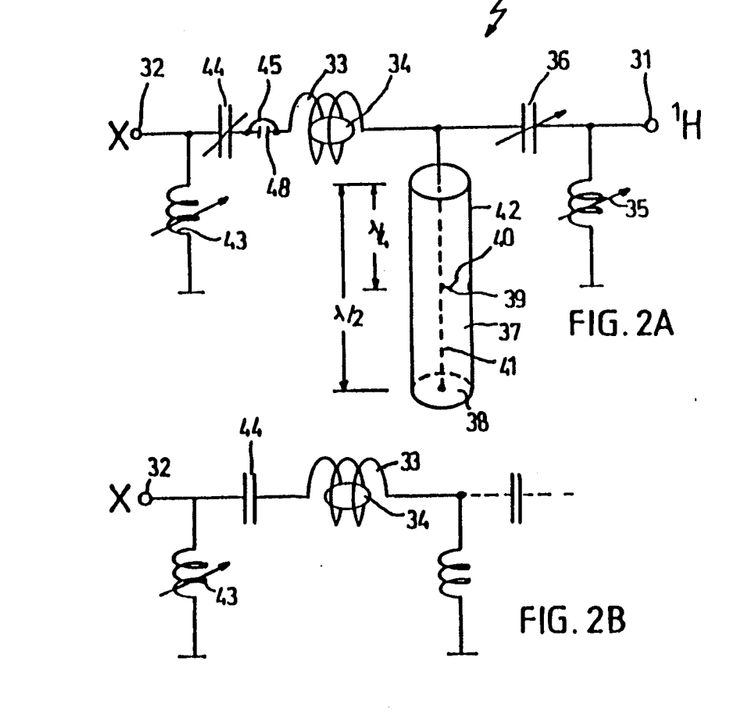

In contrast, FIG. 2A shows a network of a sample head 30 according to the invention.

This network is identical to that of FIG. 1A insofar as there are provided a first input terminal 31 for the measuring signal of the first kind of nuclei ($^1H$) and a second input terminal 32 for the measuring signals of the second kind of nuclei (X). A measuring coil 33 encloses again a sample 34. The first input terminal 31 is connected to ground potential via a variable inductance 35 and to the measuring coil 33 via a variable capacitance 36, and again to a r.f. line 37 which this time has an electric length of $\lambda/2$. The other end 38 of the $\lambda/2$ line is open. At half the length of the $\lambda/2$ line 37, i.e. at an electric distance of $\lambda/4$ from the end of the $\lambda/2$ line 37 which is connected to the measuring coil 33, there is provided an electrically conductive jumper 39 which is, preferably, equipped with an interruptor 40. In the active condition, the jumper 39 constitutes an electrically conductive connection between an inner conductor 41 and an outer conductor 42 of the $\lambda/2$ line 37.

The second input terminal 32 in its turn is connected to ground potential via a variable inductance 43, and to the measuring coil 33 via a variable capacitance 44 and across a rejecter circuit for the first frequency, consisting of a short strap 45 and a capacitor 48. The network according to FIG. 2A does not make use of another r.f. line as connected at this point in the network according to FIG. 1A.

Regarding now the network illustrated in FIG. 2A, initially without the jumper 39 and the interruptor 40 (the inductance of the strap 45 which is shunted out by the capacitor 48 can be neglected for the lower frequencies), it can be seen (FIG. 2C) that the arrangement is suited for X frequencies higher than those envisaged in FIG. 1B for the network illustrated in FIG. 1A. By "higher" frequency one understands in this connection frequencies in the order of half the frequency of the first kind of nuclei ($^1$H) whose signals are fed in through the first input terminal 31. The before-mentioned isotope $^{31}$P whose frequency of 162.0 MHz is in the range of half the proton frequency ($^1$H) of 400.0 MHz, may be regarded as an example.

The open $\lambda/2$ line 37 corresponds at this frequency of 162 MHz to an open line of a length smaller than one fourth of the wavelength. It constitutes a capacitance, as indicated by 49 in the equivalent circuit diagram of FIG. 2C where the network of FIG. 2A is illustrated, viewed from the second input terminal 32. FIG. 2D shows the network of FIG. 2A in an analogous way, viewed from the first input terminal 31. The capacitor 38 represents substantially the capacitance of the supply line and of the wall feed-through on the left side of the measuring coil 33.

Figure 2C:
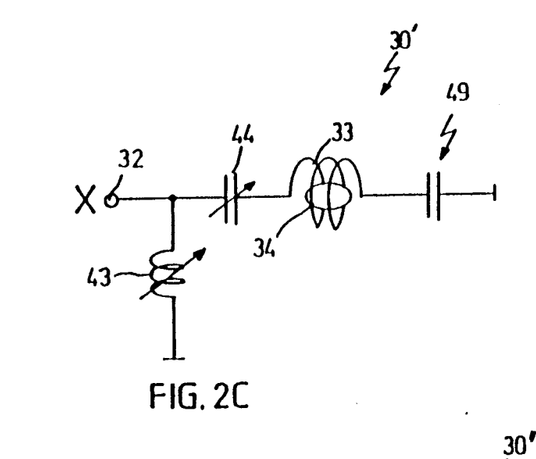
Figure 2D:
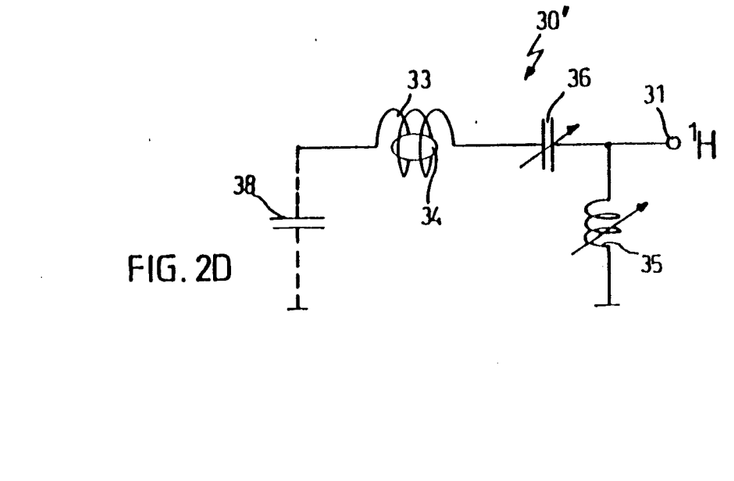

As during the tuning process to lower frequencies the capacitance symbolized by 49 in FIG. 2C determines the resonant frequency of the resonant circuit to an ever increasing degree, there results a lower frequency limit which cannot be extended substantially in downward direction, not even by providing a considerably bigger capacitor 44.

Consequently, FIG. 2D illustrates that the network according to FIG. 2A is suited for the signals of the first kind of nuclei at least as well as the network according to FIG. 1A; on the other hand, however, relatively high frequencies can be used for the signals of the second kind of nuclei, up to half the order of magnitude of the frequencies of the first kind of nuclei. The characteristics of the network according to FIG. 2A are more favorable for these relatively high second frequencies than those of the network according to FIG. 1A because in the case of the network according to FIG. 2A the inductance 17 encountered with the $\lambda/4$ lines of the network according to FIG. 1A (compare FIG. 1B) disappears due to the $\lambda/2$ line with its open end 38. In addition, the network according to FIG. 2A provides the advantage that the resonant circuit for the X frequency is no longer connected to ground potential on the right side only, i.e. that it is no longer asymmetrical from the start. The network according to FIG. 2A, therefore, permits higher X frequencies, with unchanged measuring coil 13 or 33, respectively, and the efficiency of the arrangement is increased as well because of the increased space factor, which is due to the fact that the inductance of the measuring coil 33, being the only element effective in the resonant circuit for the X frequencies (FIG. 2C) is filled up by the sample 34 while in the case of the network according to FIG. 1A the inductance 17 (FIG. 1B), being an unavoidable inductance, was not employed by the sample substance.

The invention now provides for the arrangement of an additional switchable jumper or bridge means 39 in the $\lambda/2$ line 37, at a distance of $\lambda/4$ from the end connected to the measuring coil 33. When this jumper 39 establishes a conductive connection (interruptor 40 in the closed condition, FIG. 2B), the line 37 represents an inductance for the second frequency, just as in the case of FIG. 1A, which means that the operation of the arrangement according to FIG. 2A is identical in this respect to that of FIG. 1A or, to say it in other words, that the network according to FIG. 2A is now suited for lower X frequencies, with the jumper 39 in the closed condition. By increasing the capacitance 44 (for example by connecting additional capacitors in parallel) the frequency range for the lower frequencies may be widened additionally in downward direction.

The conductive jumper 39 being located at the point of a voltage node (for the first frequency) on line 37, the function of the arrangement for the first kind of nuclei ($^1$H) will not be impaired. Consequently, the sample head 30 is equally suited for proton measurements regardless of whether the jumper 39 is in the conductive or the non-conductive state.

In conclusion this means that the sample head 30 with the network according to FIG. 2A is suited for lower X frequencies, i.e. for measurements on $^{15}$N or $^{13}$C with the jumper 39 in the conductive state, while higher X frequencies, for example for $^{31}$P measurements are possible when the jumper 39 is in the conductive state or removed.

Figure 3A:
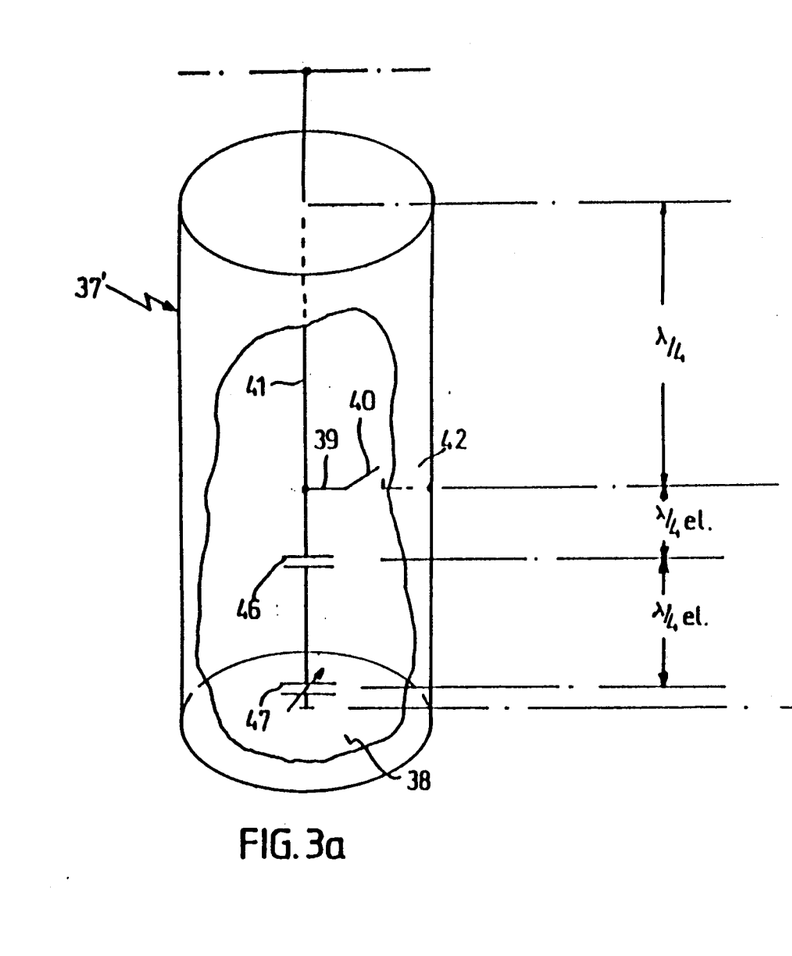
FIG. 3A shows a perspective view, broken away in part, of another r.f. line suited for use in connection with the network according to FIG. 2A.

FIG. 3A shows another embodiment 37' of the r.f. line in enlarged scale. It can be seen that here two additional capacitors 46 and 47 are connected in series into the inner conductor 41, in the lower line section, below the connection of the jumper 39.

The capacitors 46, 47, which may be adjustable as indicated at 47, serve the purpose to shorten the lower half of the line 37' electrically. The geometric length of the line 37' below the jumper 39 may, therefore, be shorter than the length above the jumper 39.

The lower capacitor 47 is arranged at a short distance above the end 38 and may, preferably, be connected to ground potential at this point.

Figure 3B:
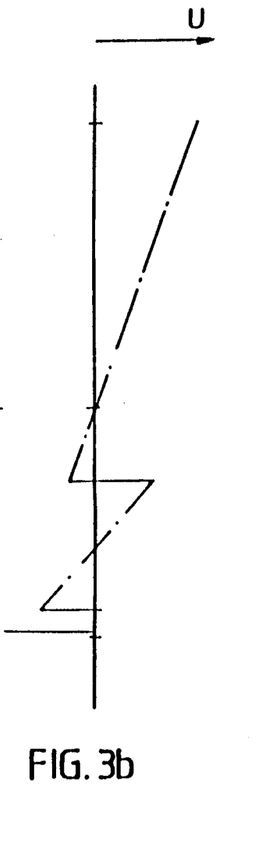
FIG. 3B shows a voltage curve, related to the case of the higher frequency, along the axis of the r.f. line of FIG. 3A.

FIG. 3B shows in this connection the curve of the voltage U for the $^1$H frequency over the axial length of the line 37', for a given sizing of the capacitors 46 and 47.

If one regards the effects that the capacitors 46, 47 have on the higher frequencies (FIG. 2C) one notes that due to their series connection the capacitors 46, 47 result in a capacitance relief of the X circuit (reduction of the capacitance 49 in FIG. 2C), thus providing the possibility to extend the frequency range for higher X frequencies still further in upward direction.

Figure 4:
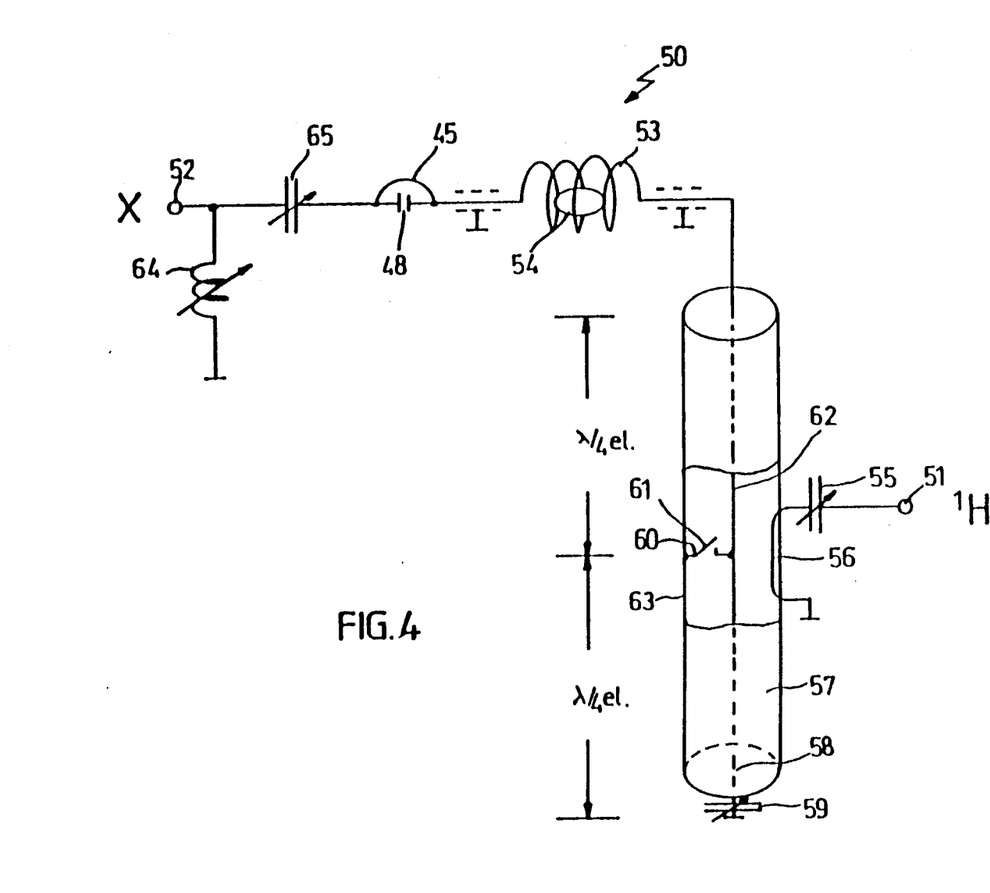
FIG. 4 shows another network similar to that of FIG. 2A, but for another embodiment of the invention.

Finally, FIG. 4 shows another embodiment of the invention comprising a sample head 50 where the proton signal is supplied via a first input terminal 51 and the X signal is again supplied via a second input terminal 52. A sample 54 is again enclosed by a measuring coil 53. The first input terminal 51 is connected, via a tunable capacitor 55, to an input coupling loop 56 acting laterally on a $\lambda/2$ line 57. A lower end 58 of the (shortened) $\lambda/2$ line is preferably connected to ground potential via an adjustable capacitor 59. An electrically conductive jumper 60 with an interrupter 61 is again arranged at an electric distance of $\lambda/4$ from the upper end of the line 57 for the purpose of connecting an inner conductor 62 to an outer conductor 63 of the line 57 by actuation of the interrupter 61.

The second input terminal 52 is connected to ground potential via an adjustable inductance 64, and to the measuring coil 53 via an adjustable capacitor 65, the other end of the measuring coil 53 being connected to the upper end of the line 57.

The sample head 50 according to FIG. 4, therefore, distinguishes itself from the sample head 30 of FIG. 2A only by the way in which the $^1$H signal is connected. Contrary to the network according to FIG. 2A, this signal is fed into the $\lambda/2$ line 57 via the loop 56, approximately at the place of a current antinode. The current antinode may be located, for example, at an electric distance of $\lambda/4$ from the upper end of the line 57; but when the capacitors 46, 47 according to FIG. 3A are used, the loop 56 may also be arranged between the capacitors 46 and 47, i.e. at the point where the curve of the voltage U according to FIG. 3B passes through zero.

I claim:

1. A sample head for performing nuclear magnetic resonance experiments on a first kind of nuclei ($^1$H) and, further, on a second ($^{15}$N, $^{31}$P) and, alternately a third ($^{31}$P) kind of nuclei within a magnetic field (B), the sample head comprising:

a measuring coil for interacting with a sample under analysis and for generating a nuclear magnetic resonance within said sample or for receiving a nuclear magnetic resonance signal from said sample;

a first sample head terminal connected to a first end of said measuring coil for transmitting to or receiving from said measuring coil a first high-frequency signal having a first, higher frequency corresponding to a nuclear magnetic resonance frequency of said first kind of nuclei ($^1$H) within said magnetic field (B);

a second sample head terminal connected to a second end of said measuring coil for transmitting to or receiving from said measuring soil a second and, alternately a third high-frequency signal having a second and, alternately a third, lower frequency corresponding to a nuclear magnetic resonance frequency of said second or third kind of nuclei ($^{15}$N, $^{31}$P), respectively, within said magnetic field (B);

a high frequency line connected to said measuring coil at said second end thereof, said line having an electric length which is an integer multiple of a quarter wavelength corresponding to said first, higher frequency; and switching means associated with said high-frequency line for switching said electrical length thereof from a first mode of operation for experiments where said second, lower frequency corresponding to said second kind of nuclei ($^{15}$N) is about one order of magnitude lower than said first, higher frequency corresponding to said first kind of nuclei ($^1$H), and said line, at said second, lower frequency, has a first electrical length such that it acts as an inductance connected in series with said measuring coil, to a second mode of operation for experiments where said third, lower frequency corresponding to said third kind of nuclei ($^{31}$P) is up to one half of said first, higher frequency corresponding to said first kind of nuclei ($^1$H), and said line, at said third, lower frequency, has a second electrical length such that it acts as a capacitance connected in series with said measuring coil.

2. The sample head of claim 1, wherein in said first mode of operation said electric length of said line is adjusted to one fourth of said wavelength of said first, higher frequency corresponding to said first kind of nuclei ($^1$H), while for said second mode of operation said electric length of said line is adjusted to have said wavelength of said first, higher frequency corresponding to said first kind of nuclei ($^1$H), or an integer multiple thereof.

3. The sample head of claim 1, wherein said switching means comprises bridge means for being connected between conductors of said line at a distance of one fourth of said wavelength corresponding to said first kind of nuclei ($^1$H), as measured from said end of said line connected to said measuring coil.

4. The sample head of claim 3, wherein said bridge means is adapted for being connected between said conductors by soldering.

5. The sample head of claim 3, wherein said bridge means is firmly arranged between said conductors and is provided with a breaker contact.

6. The sample head of claim 1, wherein said high-frequency signal corresponding to said first kind of nuclei ($^1$H) is fed to or received from a connection point between said measuring coil and said line.

7. The sample head of claim 1, wherein said high-frequency signal corresponding to said first kind of nuclei ($^1$H) is fed to or received from said line via a loop located at approximately one fourth of said wavelength corresponding to the first kind of nuclei ($^1$H) from said end of said line connected to said measuring coil.

8. The sample head of claim 1, wherein said line is provided with capacitors in a portion thereof beyond one fourth of said wavelength corresponding to said first kind of nuclei ($^1$H), as measured from the end of said line connected to said measuring coil, for defining line sections within said portion having an electric length of one fourth of said wavelength corresponding to said first kind of nuclei ($^1$H).

9. The sample head of claim 1, wherein said measuring coil is designed as a surface coil adapted for being brought into contact with a sample surface.

10. The sample head of claim 1, wherein means are provided for rotating said sample at the "magic angle".

11. The sample head of claim 1, wherein means are provided for carrying out a first measurement in one of said modes of operation and, thereafter, carrying out a second measurement in another one of said modes of operation with said sample and said sample head remaining within said magnetic field during the carrying out of said two measurements.

12. The sample head of claim 1, wherein said first, higher frequency corresponding to said first kind of nuclei ($^1$H) is higher than or equal to 360 MHz.

13. The sample head of claim 1, wherein said second, lower frequency corresponding to said second ($^{15}$N) or said third ($^{31}$P) kind of nuclei is within a range spanning from 10% to 40% of said first, higher frequency.

14. The sample head of claim 1, wherein means are provided for decoupling one kind of said nuclei at high high-frequency power.

15. The sample head of claim 1, wherein means are provided for cross-polarization between different ones of said kinds of nuclei.

16. The sample head of claim 1, wherein means are provided for carrying out volume-selective measurements.

17. The sample head of claim 1, wherein means are provided for carrying out nuclear spin tomography.

18. The sample head of claim 1, wherein means are provided for carrying out analytical measurements on living samples.

* * * * *